US007362622B2

(12) United States Patent
Braun et al.

(10) Patent No.: US 7,362,622 B2
(45) Date of Patent: Apr. 22, 2008

(54) SYSTEM FOR DETERMINING A REFERENCE LEVEL AND EVALUATING A SIGNAL ON THE BASIS OF THE REFERENCE LEVEL

(75) Inventors: Georg Braun, Holzkirchen (DE); Maksim Kuzmenka, Munich (DE); Hermann Ruckerbauer, Moos (DE)

(73) Assignee: Infineon Technologies AG, Munich (DE)

( * ) Notice: Subject to any disclaimer, the term of this patent is extended or adjusted under 35 U.S.C. 154(b) by 187 days.

(21) Appl. No.: 11/099,222

(22) Filed: Apr. 5, 2005

(65) Prior Publication Data

US 2006/0092715 A1    May 4, 2006

(30) Foreign Application Priority Data

Apr. 13, 2004   (DE) ................. 10 2004 017 863

(51) Int. Cl.
*G11C 7/10* (2006.01)
*G11C 7/20* (2006.01)
*G06F 9/00* (2006.01)

(52) U.S. Cl. .................. 365/189.09; 365/189.03; 365/201; 365/189.05; 365/191; 365/189.07; 713/1; 327/77; 327/72

(58) Field of Classification Search .......... 365/189.09, 365/189.07, 185.2, 211, 212, 189.03
See application file for complete search history.

(56) References Cited

U.S. PATENT DOCUMENTS

| 5,270,972 | A  | * | 12/1993 | Craig et al. ............ 365/189.03 |
| 5,801,552 | A  | * | 9/1998  | Moore .......................... 327/62 |
| 6,784,744 | B2 | * | 8/2004  | Tichauer ..................... 330/285 |
| 6,922,071 | B2 | * | 7/2005  | Dabral et al. ................. 326/26 |
| 6,967,591 | B1 | * | 11/2005 | Dwelley et al. ....... 340/870.21 |
| 2003/0043935 | A1 | | 3/2003 | Noh |

FOREIGN PATENT DOCUMENTS

DE    102 38 494 A1    4/2003

* cited by examiner

*Primary Examiner*—Amir Zarabian
*Assistant Examiner*—Michael Weinberg
(74) *Attorney, Agent, or Firm*—Slater & Matsil, L.L.P.

(57) ABSTRACT

A circuit exhibits a signal input, means for determining a reference level on the basis of properties of a signal received at the signal input. In addition, the circuit further exhibits means for evaluating the signal on the basis of the reference level.

26 Claims, 9 Drawing Sheets

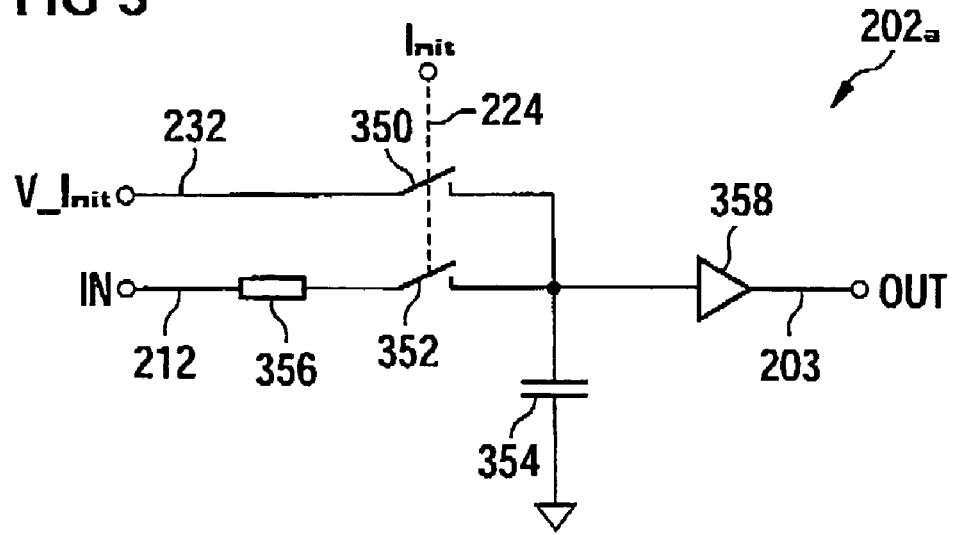
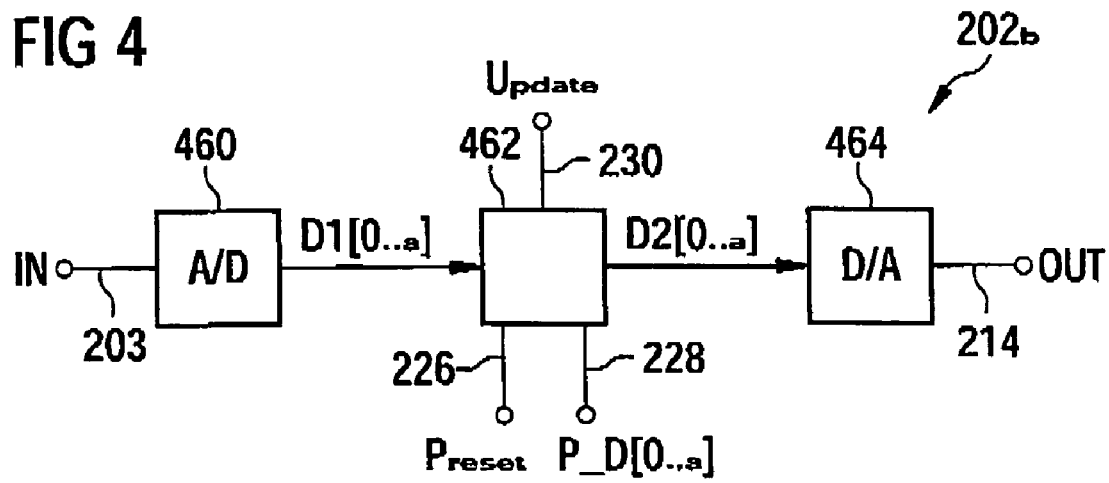

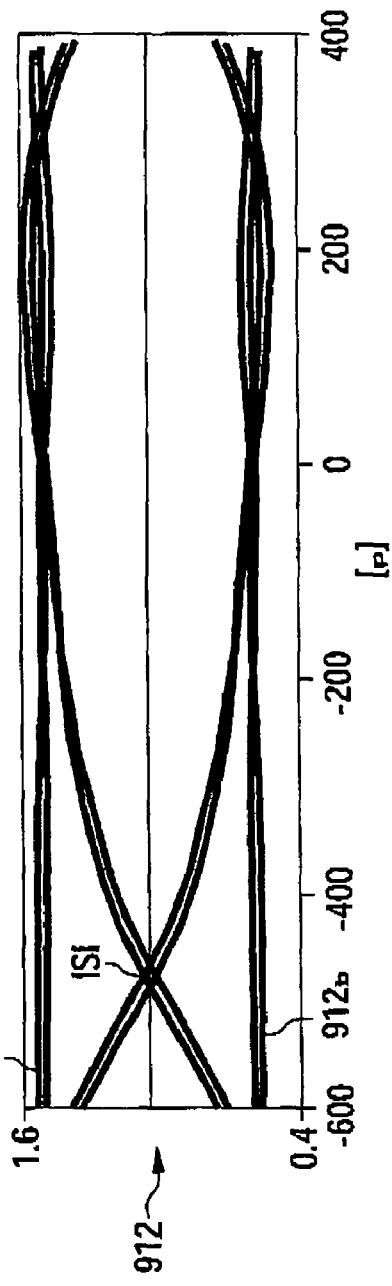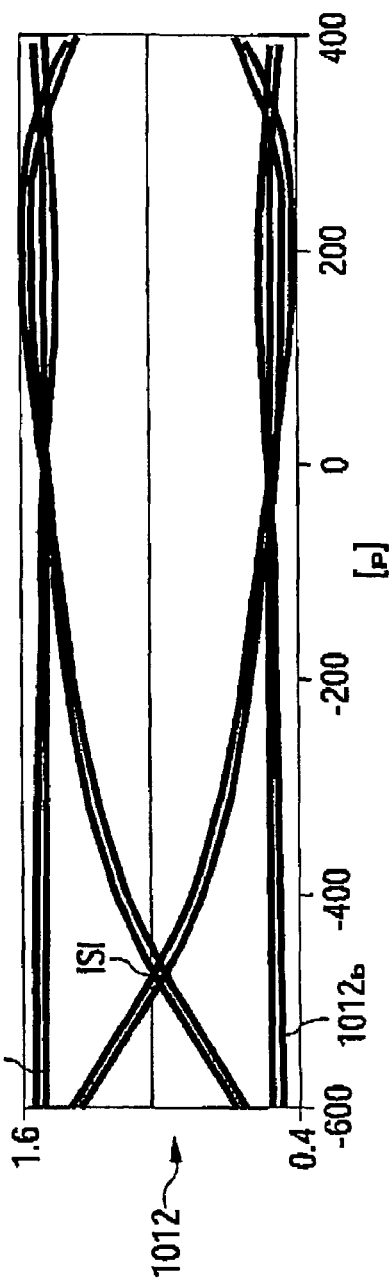

SYSTEM FOR DETERMINING A REFERENCE LEVEL AND EVALUATING A SIGNAL ON THE BASIS OF THE REFERENCE LEVEL

CROSS-REFERENCE TO RELATED APPLICATION

This application claims priority from German Patent Application No. 102004017863.1, which was filed on Apr. 13, 2004, and is incorporated herein by reference in its entirety.

TECHNICAL FIELD

The present invention relates to a circuit in which a signal received is evaluated on the basis of a reference level, as is employed, in particular, in memory systems.

BACKGROUND

FIG. 8 depicts a memory system comprising two DRAMs (dynamic random access memories) 800a, 800b as well as a memory controller 801. Memory controller 801 as well as DRAMs 800a, 800b are connected via signal lines transmitting the signals DQ[c] and DQ[d]. Signals DQ[c], DQ[d] are connected to input and/or output circuits of memory controller 801 as well as of DRAMs 800a, 800b. FIG. 8 depicts a diagrammatic representation of a point to two-point connection (P22P), as is expected, for example, for a DDR3 databus. FIG. 8 depicts two input and output circuits, respectively, both for memory controller 801 and for DRAMs 800a, 800b. Each of these input and output circuits comprises an input buffer 804, 804', 836, 836', an output buffer 834, 834', 838, 838', a termination resistor RTT as well as an output drive strength RON. An output drive strength is marked by RON. For evaluating the signals DQ[c], DQ[d] received, input buffers 804, 804', 836, 836' are connected both to signals DQ[c], DQ[d] and to an external reference voltage signal VREF_ext generated by a reference voltage generator 832'. Evaluation is effected by comparing a signal voltage of signals DQ[c], DQ[d] to a reference voltage provided by the reference voltage signal VREF_ext.

If the signal voltage exceeds the reference voltage, a first logical value is detected; if the signal voltage falls short of the reference voltage, however, a second logical value is detected and provided by input buffers 804, 804', 836, 836' to DRAMs 800a, 800b, or to memory controller 801. The lines of signals DQ[c], DQ[d] are terminated, in DRAMs 800a, 800b and in the memory controller 801, via termination resistors RTT with a termination voltage which is provided by a termination signal VTT_ext to DRAMs 800a, 800b as well as to memory controller 801, and is generated by a termination voltage generator 833'. Signals DQ[c], DQ[d] are bidirectional signals driven by output buffers 834, 834', 838, 838'. Signals DQ[c], DQ[d] are chosen by way of example. Memory controller 801 as well as DRAMs 800a, 800b usually comprise a multiplicity of further signal input and output circuits which, however, are not depicted for reasons of clarity.

Instead of the reference voltage supply provided by reference voltage generator 832', a reference voltage supply may be effected, alternatively, individually per chip, for example using separate reference voltage generators or internal reference voltage generation on each chip.

In a write case, data is transmitted via data signals DQ[c], DQ[d] from memory controller 801 with RON as the output drive strength to one or both DRAMs 800a, 800b, each of which comprises the termination resistor RTT. Such a write case will be described by way of example in the figures below. However, this does not represent a limitation, since the write case described may be transferred to any kind of data transfer with different possibilities of combining output drive circuits, termination circuits and input receiving circuits.

As data rates on interface buses of memory chips increase, for example signals DQ[c], DQ[d], shown in FIG. 8, between memory controller 801 and DRAMs 800a, 800b, the requirements placed on the interface circuits of the memory components in terms of accuracy are also on the increase. The requirements in terms of accuracy may be categorized by the type of interface circuits such as output driver, input receiver, termination circuits, i.e., in FIG. 8 input buffers 804, 804', 836, 836', output buffers 834, 834', 838, 838' as well as termination resistors RTT. In addition, the requirements in terms of accuracy may be categorized by the type of requirements, such as accuracy of resistances, voltage ranges, timing requirements or load capacities.

A potential combination of accuracy requirements may be as follows, for example:
output driver (off-chip driver, OCD):
output impedance: 40Ω+/−10%
output timing accuracy, tDQSQ, tQHS, tAC, tDQSCK: +/−125 picoseconds . . . +/−150 picoseconds
parasitic capacitance at IO pin (sum of all IO circuits and housings): 2 . . . 3 Pf
input receiving circuit (receiver, RCV):
Vin AC: Vref+/−200 mV
Vin DC: Vref+/−100 mV
Vref: 1.05 V+/−40 mV
termination circuit (on-die termination, ODT):
termination resistor RTT: 60Ω or 120Ω+/−10%
termination voltage VTT: 1.5 V+/−75 mV FIGS. 9 and 10 show simulated data eyes 912, 1012 of data signals DQ[c], DQ[d] shown in FIG. 8. FIG. 9 shows the simulated data eye 912 at the input amplifiers of the two DRAMs shown in FIG. 8, at nominally set RON and RTT values and at a termination voltage VTT of 1.5 V. Termination voltage VTT is provided by the termination voltage generator depicted in FIG. 8. The data signal shown alternates between an upper voltage value 912a at about 1.5 V and a lower voltage value 912b at about 0.6 V. The two voltage values 912a, 912b correspond to two signal states which are referred to as "high" and "low" and designate the value of a data bit transmitted. The data eye is symmetrical in relation to a reference voltage VREF=1.05 V assumed to be nominal. Reference voltage VREF is generated, in FIG. 8, by the reference voltage generator. The case depicted in FIG. 9 is ideal, since identical conditions apply to both signal states 912a, 912b. In this and in subsequent figures, an intersymbol interference (ISI) is defined as a width of a crossing area of the data eye and reference voltage VREF. In the ideal case depicted in FIG. 9, the ISI has a width of 30 picoseconds. An output driver resistor RON_CTRL has a value of 40 ohms, and a termination resistor has a value of 120 ohms.

FIG. 10 shows data eye 1012 for the event that an output driver has a slightly lower resistance, and that a termination resistor has a slightly higher resistance in comparison with the embodiment shown in FIG. 9. Instead of the nominal values in FIG. 9, in FIG. 10, the output drive strength RON=0.9*RON_nom, and the termination resistor RTT=1.1*RTT_nom. Termination voltage VTT continues to be 1.5 V. As a result, only the low level 1012b at the input amplifiers of the two DRAMs is shifted from about 0.6 V in FIG. 9 to 0.5 V in FIG. 10. The high level 1012a remains unchanged at about 1.5 V. This causes a crossing point ISI' of the data eye of signal 1012 to no longer coincide with reference voltage VREF=1.05 V, but to go down. Hereby, a time available to the input amplifiers for recognizing a logical 1 is reduced. This expressed by ISI' measured at the reference voltage value of 1.05 V. It increases from about 30 picoseconds in FIG. 9 to about 50 picoseconds. An output drive resistor RON_CTRL has a value of 36 ohms and a termination resistor has a value of 132 ohms.

The shift of the data eye, described with reference to FIG. 10, relative to reference voltage VREF occurs especially when termination voltage VTT nominally is set to a different value than reference voltage VREF. This is the case, for example, with new memory interfaces. With GDDR3 (graphics DDR3), termination voltage VTT, for example, equals 1.8 V, and reference voltage VREF=1.26 V. With the future standard for DDR3 commodity DRAMs, what is currently expected is VTT=1.5 V, and VREF=1.05 V.

FIG. 11 depicts an increase in the ISI discussed with reference to FIGS. 9 and 10, measured at a nominal reference voltage VREF_nom=1.05 V, depicted as ISI_sim_Vref_nom as a function of an opposite parameter variation of RON and RTT. At RON=0.8*RON_nom and RTT=1.2*RTT_nom the ISI increases to about 80 picoseconds as against 30 picoseconds in the nominal case. In addition, FIG. 11 shows that with deviations of about +/−20% or +/−30%, a simple approximation formula may be used for calculating the ISI. If an input slew rate of 2.4 V/ns is assumed at the input amplifiers (this value matching the data eye depicted in FIG. 9), an additionally occurring ISI may be calculated using a slope triangle consisting of voltage, time and slew rate, as is depicted as ISI_cal_2.4 V/ns in FIG. 11.

Thus, FIG. 11 allows the conclusion that a maximally admissible deviation from the nominal value at RON and RTT must be limited to +/−10% so as to limit any occurring ISI to about 65 picoseconds, with nominal VREF.

With current memory-interface standards such as DDR2 or GDDR3, the above accuracy requirements are met in that the output drivers and/or the termination resistors are adjustable, within certain limits, on the chip. By corresponding calibration routines, the actual values of these resistors in the system are approximated to the nominal value as far as possible.

With DDR2, a calibration in the system is performed by the memory controller. This is disadvantageous since it requires a time-consuming calibration protocol as well as complex implementation. In addition, the chip pins have a high capacitance caused by a fine-tunability of the drive strength RON.

With GDDR3, the chips in the system are auto-calibrated. This is disadvantageous since highly accurate, external or possibly also internal reference resistors are required. In addition, the chip pins have a high capacitance caused by a fine-tunability of drive strength RON and termination strength RTT.

SUMMARY OF THE INVENTION

It is an object of the present invention to provide a circuit as well as a method for receiving a signal which exhibit a high degree of flexibility.

In accordance with a first aspect, the invention provides a circuit having: a signal input; a determinator for determining a reference level on the basis of properties of a signal received at the signal input; and an evaluator for evaluating a signal received at the signal input on the basis of the reference level.

In accordance with a second aspect, the invention provides a method including the steps of: (a) providing a signal at a signal input; (b) determining a reference level on the basis of properties of a signal received at the signal input; and (c) evaluating a signal received at the signal input on the basis of the reference level.

The present invention is based on the findings that a reference level, which is required for evaluating a signal received, may be advantageously determined from properties of the signal received. This is advantageous, since the problem of interface accuracy requirements is solved in that the reference voltage required by the receiving chip is generated on each receiving chip itself and is calibrated on the fly. Thus, the reference voltage required for receiving signals is calibrated to an optimum value on the fly individually per chip.

By calibrating the reference level, one data eye of the signal is again symmetrical with regard to the reference level, which is typically a reference voltage. This allows the data transmission rate to be increased. A transmission of different signal values, i.e., 0 and 1, is effected equally well. A further advantage is that calibration of the output drive strength RON and of the termination resistor RTT may optionally be performed or may be dispensed with, depending on the level of variations of the output drive strength or the termination resistor, caused by process fluctuations, supply voltage tolerances and temperature dependencies. Since drive strength RON and termination resistor RTT no longer need to be adjustable, or only need to be adjustable within very large steps, the number of transistor fingers to be switched on or off may be greatly reduced, and thus chip pins have a low capacitance.

BRIEF DESCRIPTION OF THE DRAWINGS

Preferred embodiments of the present invention will be explained below in more detail with reference to the accompanying figures, wherein:

FIG. 3 is a detailed circuit diagram of a means for determining a reference signal;

FIG. 4 is a detailed circuit diagram of a means for determining a reference level from a reference signal;

FIG. 9 is a graphic representation of a wave form of a signal depicted in FIG. 8;

FIG. 10 is a further graphic representation of a wave form of a signal depicted in FIG. 8.

DESCRIPTION OF PREFERRED EMBODIMENTS

Figure 1:
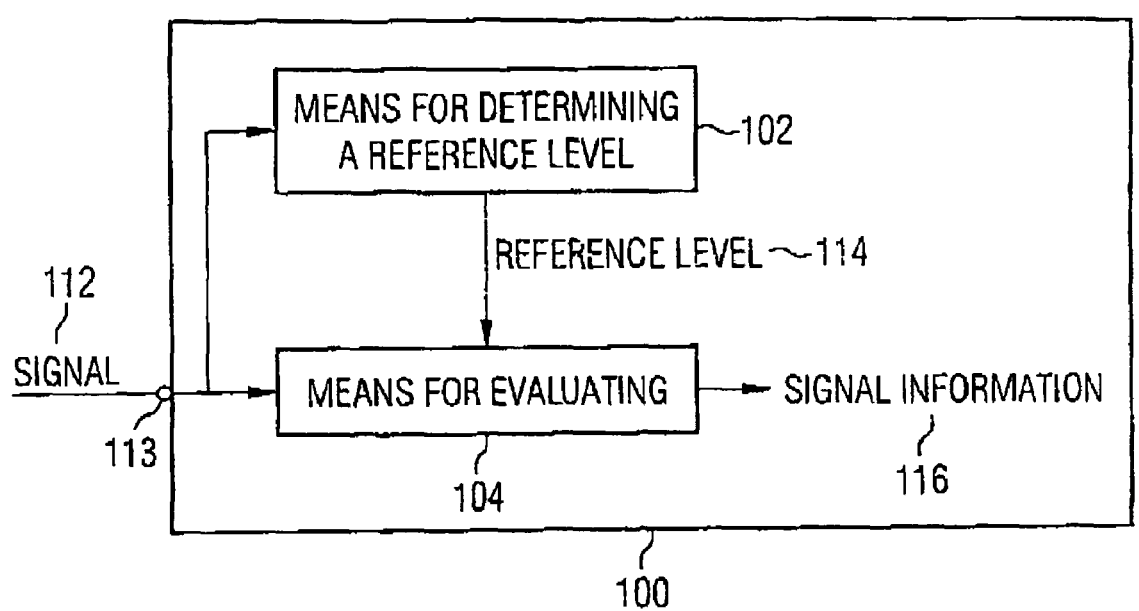
FIG. 1 is a diagrammatic representation of a circuit in accordance with the present invention.

In the following description of the preferred embodiments of the present invention, identical or similar reference numerals will be used for the various elements depicted in the drawing which act similarly, a repeated description of these elements being dispensed with.

FIG. 1 shows a diagrammatic representation of a circuit according to the present invention. Circuit 100 comprises means 102 for determining a reference level and means 104 for evaluating. A signal 112 is connected to a signal input 113 of circuit 100 and is received by means 102 for determining a reference level as well as by means 104 for evaluating. Means 102 for determining a reference level provides a reference level 114 to means 104 for evaluating. Means 104 for evaluating is configured to evaluate signal 112 on the basis of the reference level 114 and to provide signal information 116 to the circuit with the help of said evaluation. Signal information 116 corresponds to information transferred to circuit 100 via signal 112.

Means 102 for determining a reference level determines reference level 114 on the basis of properties of signal 112 received. The properties of signal 112 received characterize a signal integrity of signal 112 received. The properties of signal 112 depend both on the transmission path to circuit 100 and on reception parameters within circuit 100. In addition, the property of signal 112 depends on time-variable parameters on the grounds of supply voltage tolerances, temperature dependencies or aging processes. A change in the signal properties causes the signal 112 in means 104 for evaluating to be evaluated incorrectly, and thus causes incorrect signal information 116 to be provided for subsequent circuit blocks by means 104 for evaluating. To avoid this, means 102 for determining a reference level provides the reference level 114 adapted to the properties of signal 112. This enables means 104 for evaluating to perform a correct evaluation of signal 112.

Figure 2:
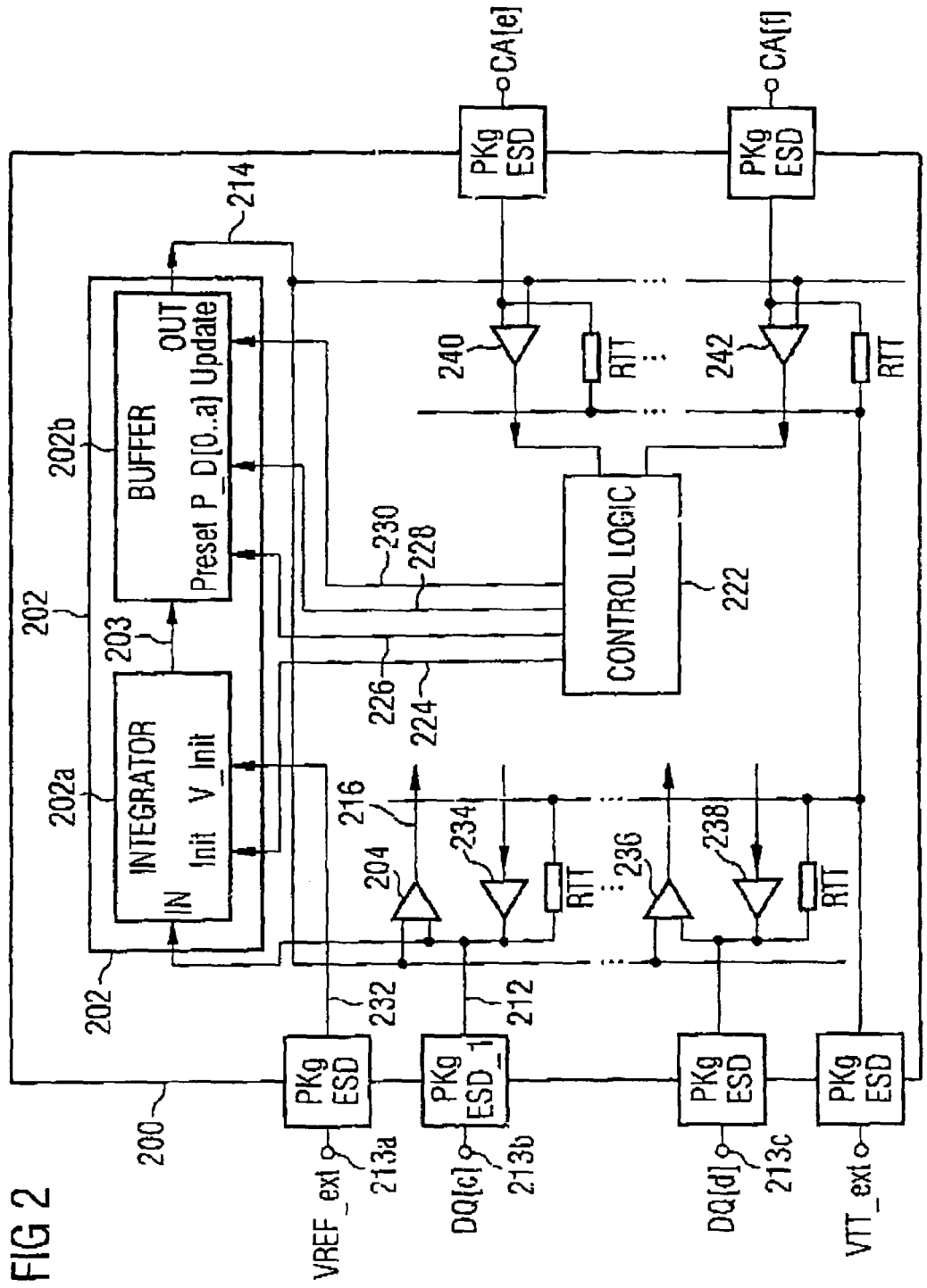
FIG. 2 is a detailed diagrammatic representation of a circuit in accordance with the present invention.

FIG. 2 shows a detailed block circuit diagram of an embodiment of a circuit 200 in the form of a memory chip in accordance with the present invention. In this embodiment, circuit 200 is a memory chip in the form of a DRAM. The memory chip comprises means 202 for determining a reference level. Means 202 for determining a reference level comprises an integrator 202a and an S/H buffer 202b (S/H=sample and hold) connected to integrator 202a via a reference signal 203. To receive an internal data signal 212 made available to memory chip 200 as a data signal DQ[c] via a signal input 113a', memory chip 200 comprises means 204 for evaluating in the form of an input amplifier. The data signal DQ[c] is subject to interference effects $Pkg_{ESD}$ (ESD=electrostatic discharge). These interference effects may be caused, for example, by inductances between the pad and the receiver, and may be realized to varying degrees at the individual signal inputs. With a signal input having an ESD protection device as a protection from electrostatic discharges, the ESD protection device also causes the signal to be influenced. A package ESD protection may be present in an identical form at all signal inputs of memory chip 200. The internal data signal 212 is terminated, in memory chip 200, with regard to a termination voltage, provided to memory chip 200 via a signal VTT_ext, via a termination resistor designated by RTT.

Means 202 for determining a reference level is configured to receive the internal data signal 212. For this purpose, internal data signal 212 is connected to an input IN of integrator 202a. Means 202 for determining a reference level provides a reference level 214. For this purpose S/H buffer 202b comprises an output OUT. In this embodiment, reference level 214 is a reference voltage. Reference voltage 214 is connected to input amplifier 204. Reference voltage 214 is a reference with regard to the internal data signal 212. Input amplifier 204 evaluates internal data signal 212 with regard to reference voltage 214 and provides signal information 216 to memory chip 200 on the basis of a comparison conducted between reference voltage 214 and internal data signal 212.

Memory chip 200 further comprises a control logic 222. The control logic provides control signals to integrator 202a and to S/H buffer 202b. In this embodiment, the control logic provides an INIT signal 224, PRESET signal 226, P_D [0 . . . a] signal 228, and UPDATE signal 230. Integrator 202a comprises a signal input INIT for receiving the INIT signal 224 as well as a signal input V_Init for receiving a V_init signal 232 which provides an external reference voltage. The S/H buffer 202b comprises a signal input PRESET for receiving the PRESET signal 226, a signal input P_D[0 . . . a] for receiving the P_D[0 . . . a] signal 228, and a signal input UPDATE for receiving the UPDATE signal 230. Integrator 202a further comprises a signal input V_init for receiving an external reference signal VREF_ext provided to memory chip 200 via a further signal input 213a. Reference signal VREF_ext provides an external reference level, in this embodiment an external reference voltage, to means 202 for determining a reference level.

Memory chip 200 comprises a plurality of data signal inputs. For reasons of clarity, FIG. 2, in addition to a data signal input for receiving the data signal DQ[c], depicts merely a further data signal input for receiving the data signal DQ[d]. Data signal DQ[d] is connected to a further input amplifier 236 via a further data signal input 213c. Input amplifier 236 in turn conducts an evaluation of data signal DQ[d] on the basis of reference voltage 214. Signal DQ[d] is not connected to the means for determining a reference level. The reference voltage 214 is determined from signal DQ[c], but is provided to all input amplifiers 216, 236, 240, 242. In this embodiment, it shall be assumed that the properties of the data signal DQ[c] resorted to for determining reference voltage 214 apply to the further data signals DQ[c], DQ[d] as well as to the command/address signals CA[e], CA[f].

In this embodiment, signals DQ[c], DQ[d] are bidirectional signals. For driving signals DQ[c], DQ[d], memory chip 200 comprises output drivers 234, 238.

Control logic 222 is controlled by the command/address signals CA[e], CA[f], which are connected to control logic 222 via input amplifiers 240, 242. Signals CA[e], CA[f] are representative of a plurality of command/address bus signals, only two of which are shown in FIG. 2 for reasons of clarity.

The signal information provided by input amplifiers 204, 236 as well as the signals received by output drivers 234, 238 are passed on to further circuit units (not shown in the figures) of memory chip 200.

In accordance with the present invention, reference voltage 214 is derived from the internal data signal 212. At the start of the operation of memory chip 200, e.g., after switching on a supply voltage, no reference voltage 214 is yet available, which was derived from the internal data signal 212 during a configuration mode. However, a reference voltage 214 is required for defect-free reception of all input signals DQ[c], DQ[d], CA[e], CA[f] of memory chip 200. To ensure this, control logic 222 causes, during an initialization mode, means 202 for determining a reference level to take over reference voltage VREF_ext offered externally. This is necessary, in particular, at the start of the operation, when no internally generated reference voltage 214 is yet available. In this manner it is ensured that it is possible, in principle, for the input receiving circuits 204, 236, 240, 242 to possibly function at a lower data transmission speed.

For determining reference voltage 214 from internal data signal 212, memory chip 200 is placed into a calibration mode or configuration mode by control logic 222 by applying specific command sequences at the command and address inputs CA[e], CA[f], which are representative of a plurality of command address bus signals. Alternatively, the calibration mode may also be started automatically, for example as part of an initialization routine, which is started when the supply voltage is applied, or after a RESET operation.

In the calibration mode, a sequence of an equal number of zeros and ones, which is applied from outside at the data pin for receiving the signal DQ[c], is passed on to the input of integrator 202a. A zero on the internal data signal 212 corresponds to a first signal voltage, or a first voltage value, and a one corresponds to a second signal voltage, or a second voltage value. After a certain time, which is determined by an embodiment of the integrator 202a, by the applied sequence of an equal number of zeros and ones, by the transmission rate, and by a voltage difference between the first voltage value and the second voltage value, reference signal 203 is applied at an output of integrator 202a in the form of a voltage corresponding to an optimum value of reference voltage 214. The corresponding control signal 230 from control logic 222 causes S/H buffer 202b to store the voltage value provided by reference signal 203, and to permanently provide it, from that point onward, as reference voltage 214 at its output OUT.

Once reference voltage 214 has been determined from internal data signal 212, the calibration operation is completed, and control logic 222 places the memory chip back into a normal mode. In the normal operation mode, the internal data signal 212 is employed as a normal data signal for transferring data to circuit 200.

In the embodiment shown in FIG. 2, reference voltage 214 is derived from only one signal, i.e., internal data signal 212. With broad signal interfaces, such as with ×16 or ×32 DRAMs, or with different signal interfaces, for example a command and address bus interface and a data bus interface, several means for determining a reference level are alternatively provided on memory chip 200. This is advantageous, in particular, whenever input signals of memory chip 200 have different properties and thus require different reference voltages to ensure defect-free evaluation of the signals received.

Means 204 for evaluating may have negative properties; for example, means 204 for evaluating may amplify rising and falling edges in an unbalanced manner. To compensate for these negative properties, a compensation means (not shown in the figures) with the same non-ideality as that of means 204 for evaluating may be connected upstream from input IN of integrator 202a. The compensation means is configured to receive the internal data signal 212 and the reference level 214 or the V_init signal 232, which provides the external reference voltage VREF_ext. In this manner, non-idealities of means 204 for evaluating are compensated for by the reference level generated internally. The output of the compensation means is connected to input IN of integrator 202a. Alternatively, the compensation means may also be a part of integrator 202a.

FIGS. 3 and 4 show an embodiment of a means for determining a reference level in the form of a potential inventive reference voltage generation and calibration circuit, consisting of an integrator and an S/H buffer in the form of a sample+hold circuit with a voltage buffer, as is depicted in FIG. 2.

FIG. 3 shows a potential implementation of the integrator 202a as an RC integrator. However, other implementations are also feasible, e.g., known integrator circuits with operational amplifiers and linear or non-linear characteristics. Also, output signal 203 of the integrator need not necessarily be a voltage. Other electrical quantities, e.g., current or load, are also feasible.

It is important and advantageous for the integrator to be resettable via a control signal 224 reserved for this purpose. Resetting enables a direct passing-through of an external reference voltage, or else an optimum selection of a starting value of the integration.

The RC integrator shown in FIG. 3 comprises the input signals 212, 224, 232 described with reference to FIG. 2, as well as output signal 203. Integrator 202a further comprises a first switch 350, a second switch 352, a resistor 356 as well as a capacitor 354, which is connected to ground. Depending on the loading of the reference signal 203 provided by integrator 202a, caused by a subsequent circuit, a voltage buffer 358 for amplifying the reference signal 203 may be provided, so that reference signal 203 becomes low in resistance. Switches 350, 352 are controlled by INIT signal 224. In the calibration mode, the first switch 350 is typically non-conductive, and the second switch 352 is conductive. If the capacitor 354 is discharged, and/or if it has a voltage that does not correspond to an optimum reference voltage of internal data signal 212, a current flows through resistor 356 and charges, or discharges, capacitor 354 until it comprises a voltage which corresponds to an optimum reference voltage of internal data signal 212. Thus, integrator 202a is a means for forming a mean value from the signal levels of internal signal 212. Internal signal 212 may be a digital signal with a defined first signal level and a defined second signal level, or an analog signal whose signal voltage varies between the first signal level and the second signal level. A time constant of the RC member is selected, with regard to a frequency of internal signal 212, such that the voltage of capacitor 354 requires a plurality of signal changes of the internal signal 212 to adjust its value.

Values of resistor 356 as well as of capacitor 354 are advantageously selected such that a time constant of the RC member is substantially larger than the length of an individual symbol (bit time) on the data transmission lines. If switch 350 is conductive, there is a direct connection between the capacitor 354 and the V_init signal 232, which provides an external reference voltage. Thus, capacitor 354 is loaded to the voltage value of the external reference voltage as quickly as possible. In this case, the second switch 352 is typically non-conductive. The capacitor voltage of capacitor 354 is output from integrator 202a as a reference signal 203.

If resistor 356 is small, a buffer, for example in the form of an input amplifier, may be connected upstream from resistor 356 and/or upstream from input IN of integrator 202a so as to provide an integrator input with as high a resistance as possible.

FIG. 4 shows a potential embodiment of an inventive sample+hold circuit, as is depicted in FIG. 2 as an S/H buffer. In addition to the embodiment depicted in FIG. 4, however, various other embodiments are also possible. In addition to the input signals 203, 226, 228, 230, and output signal 214, already described in FIG. 2, in the form of the reference voltage, S/H buffer 202b also comprises an analog-to-digital converter 460, a register 462 as well as a digital-to-analog converter 464. The register is connected to analog-to-digital converter 460 via a signal D1[0 . . . a], and to digital-to-analog converter 464 via the transfer signal D2[0 . . . a]. Reference signal 203, for example the output value of the integrator shown in FIG. 3, is made available to register 462 by the analog-to-digital converter 460.

Register 462 takes over the digital value of signal D1 [0 . . . a] only if a respective command to do so is given by control logic (depicted in FIG. 2) via the UPDATE signal 230. Depending on the coding used, changes occurring at the output of the analog-to-digital converter with a non-active UPDATE signal 230 or an active UPDATE signal 230 have an effect at the output of register 462. In this manner, a storage function of the sample+hold buffer 202b is implemented. A digital value present at the output of the register in the form of the transfer signal D2[0 . . . a] is converted back, by digital-to-analog converter 464, to an analog value corresponding to reference voltage 214. Reference voltage 214 is made available to the input amplifiers (depicted in FIG. 2). An output stage of digital-to-analog converter 464 functions as a voltage buffer in this embodiment. In the event of too strong a load, a further voltage buffer (not shown) may alternatively be inserted upstream from the signal output OUT.

Advantageously, register 462 is extended by a PRESET functionality. As a consequence of the latter, values are taken over at the output of register 462 and are provided as transfer signal D2[0 . . . a], which values are made available at the P_D[0 . . . a] signal 228, alternatively also a the P_D[0 . . . a] bus, when activating and/or deactivating, depending on the coding of the PRESET signal 226. In this manner, a specific value of reference voltage 214 may be set by a special test mode, irrespective of the signal levels that are applied to the calibration input (signal input IN in FIG. 3). P_D[0 . . . a] signal 228 may transfer test data or, alternatively, useful starting values. Different functions of the built-in self-test for an interface, also referred to as IO-BIST, may also be implemented in this manner.

Thus, register 462 may take over, triggered by the UPDATE signal, a value of the analog-to-digital converter in the form of signal D1[0 . . . a], or it may take over, triggered by the PRESET signal, the value of the PRESET data signal P_D[0 . . . a], or it may hold a value which was last stored into register 462.

Figure 5A:
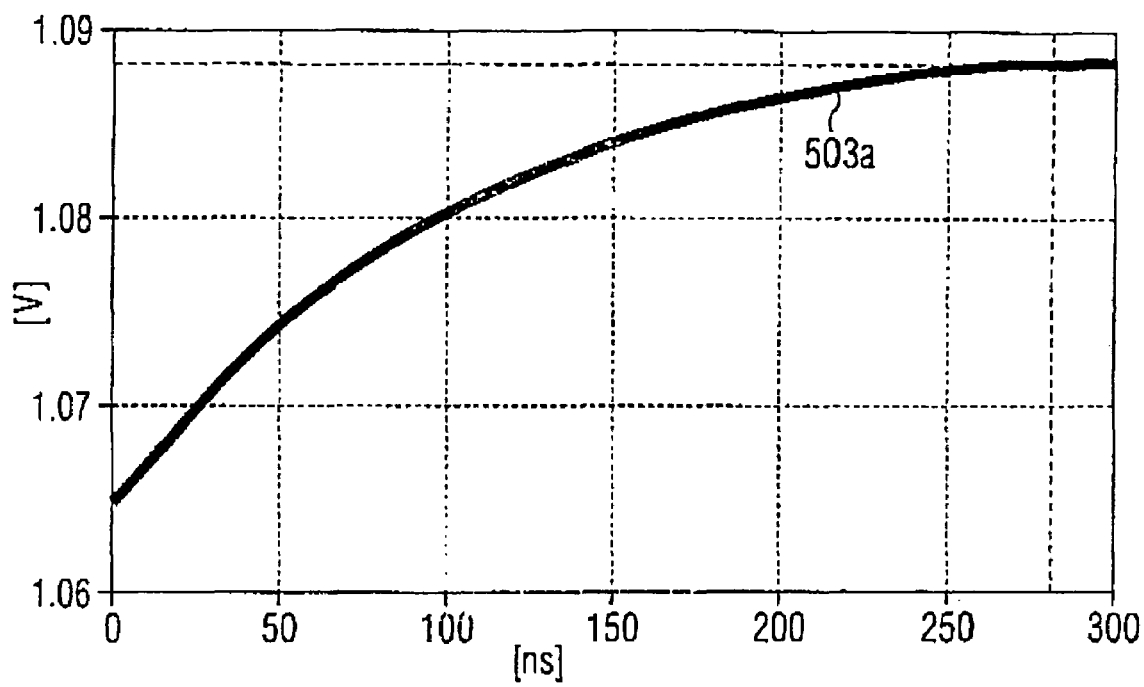
FIGS. 5a and 5b show graphic representations of a voltage time curve of the reference signal shown in FIG. 3.
Figure 5B:
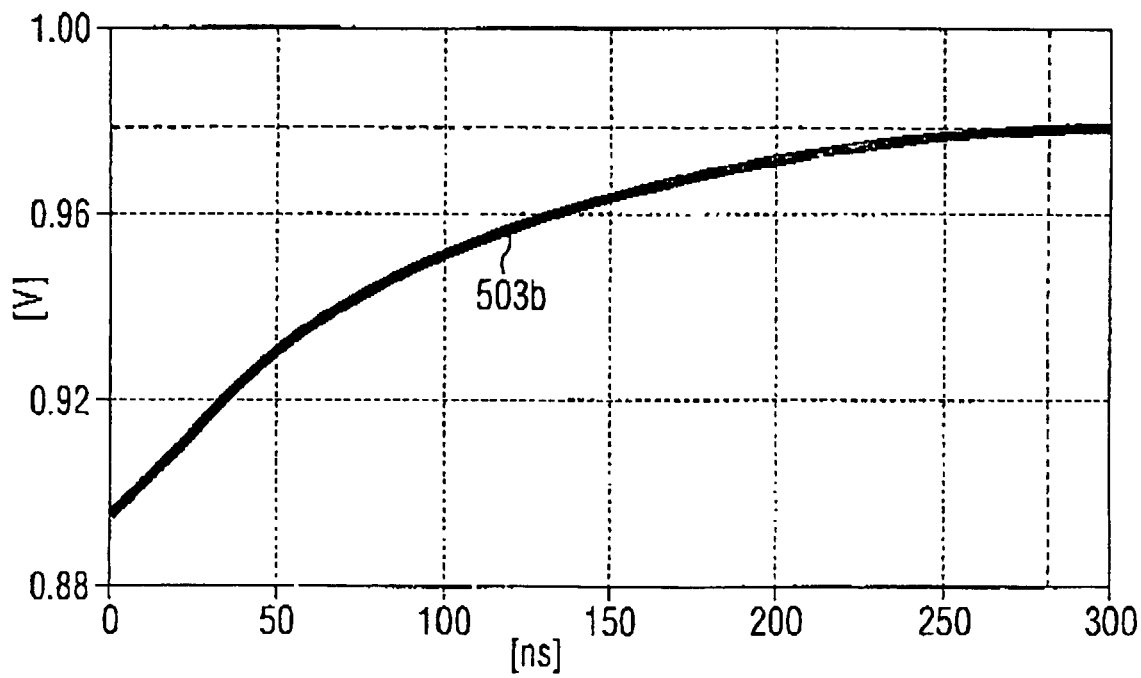

FIGS. 5A and 5B show a result of simulations of an integrator circuit as is shown in FIG. 3. It may be seen that an output voltage 503a, 503b of the integrator settles, after about 300 ns, at an optimum value, respectively, of a reference voltage, which is 1.088 V in FIG. 5A and 0.98 V in FIG. 5B. In FIG. 5A, the optimum reference voltage value of 1.088 V is reached after 280.338 ns. In FIG. 5B, the optimum reference voltage value of 978 mV is reached after 280 ns.

The simulation depicted in FIG. 5A is based on the following assumptions:

| Data source: | pulse voltage source, VLOW = 0.0 V; VHIGH = 1.5 V; tPER = 1 ns; tRISE = tFALL = 100 ps; 50% duty cycle |
|---|---|
| IO resistances: | RON = 44 Ohm; RTT = 108 Ohm |
| RC integrator: | R = 200 kOhm; C = 500 fF (=> τ = 100 ns |

The simulation shown in FIG. 5B is based on the following assumptions:

| Data source: | pulse voltage source, VLOW = 0.0 V; VHIGH = 1.5 V; tPER = 1 ns; tRISE = tFALL = 100 ps; 50% duty cycle |
|---|---|
| IO resistances: | RON = 32 Ohm; RTT = 144 Ohm |
| RC integrator: | R = 200 kOhm; C = 500 fF (=> τ = 100 ns |

Figure 6:
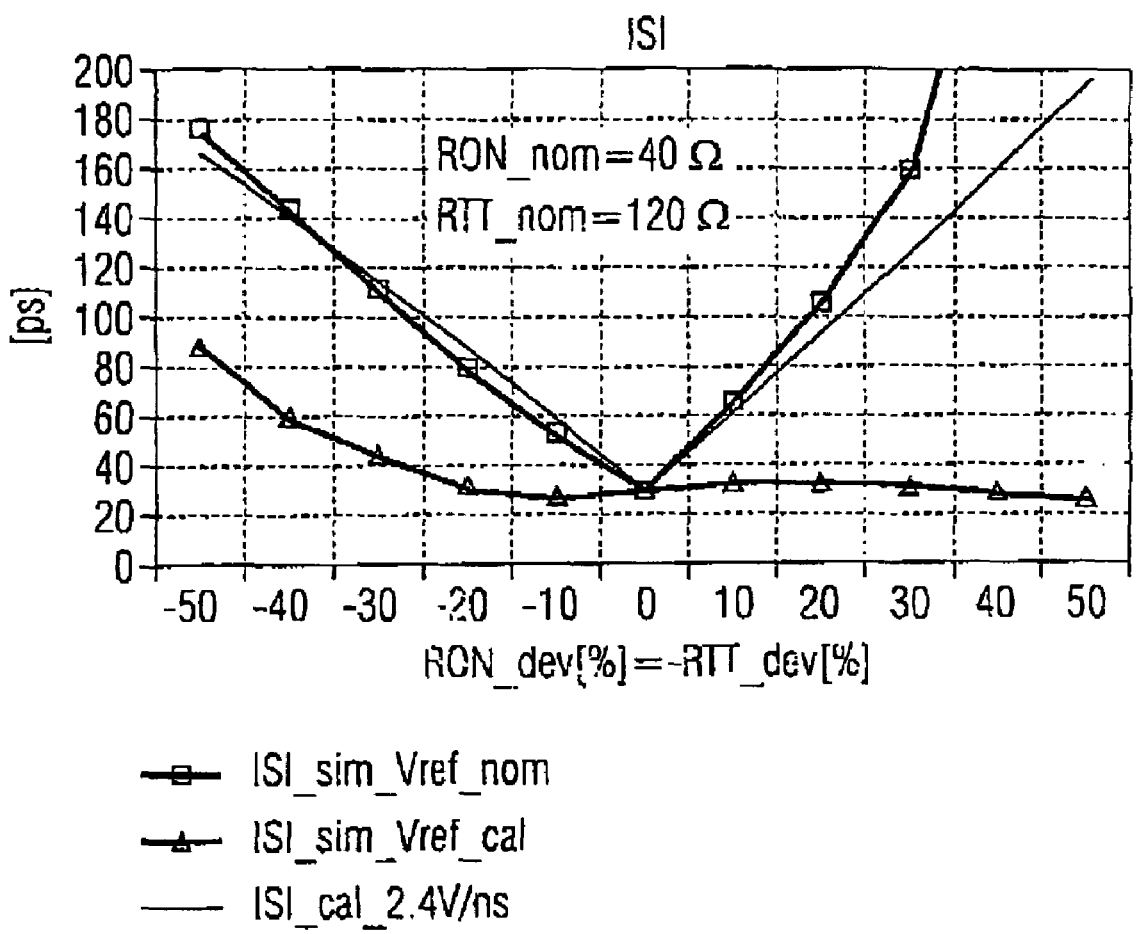
FIG. 6 is a graphic representation of an intersymbol interference of the reference signal shown in FIG. 3.
Figure 11:
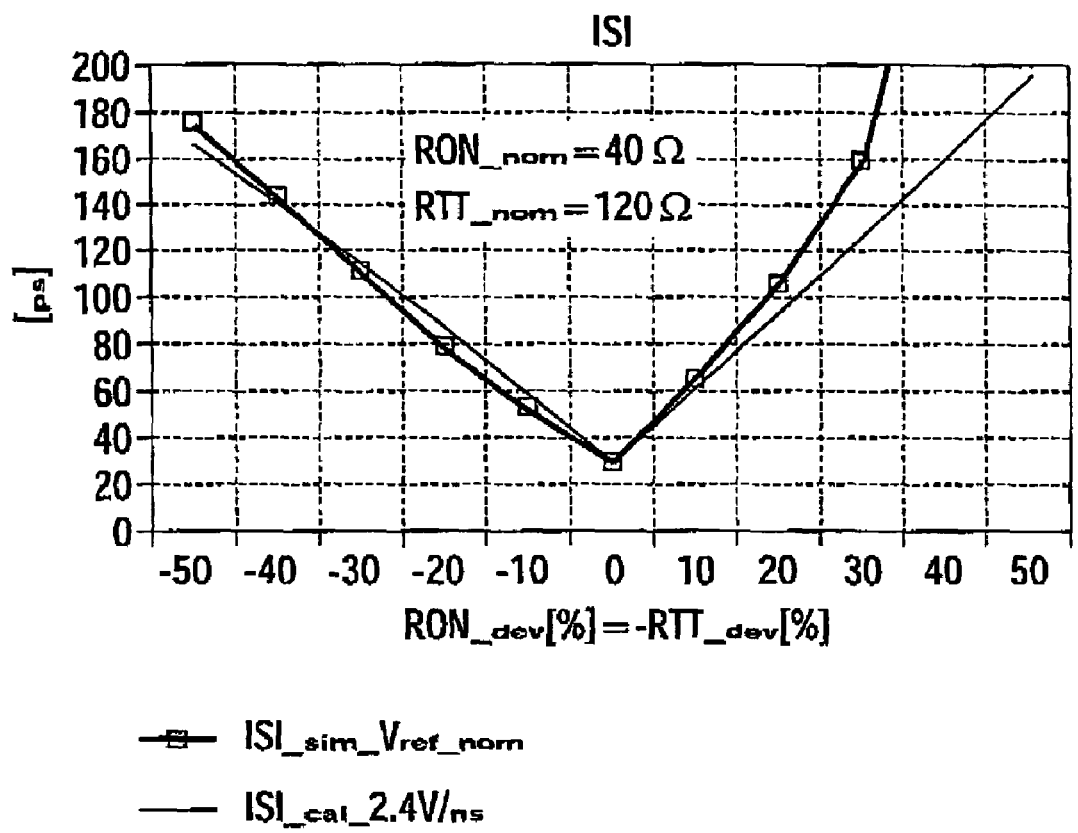
FIG. 11 is a graphic representation of a change of parameters of the circuit depicted in FIG. 8.

FIG. 6 shows a diagram as has already been explained with reference to FIG. 11. In addition to the characteristics already explained with reference to FIG. 11, FIG. 6 comprises a characteristic ISI_sim_Vref_cal, which corresponds to a simulated ISI with a Vref ideally calibrated in accordance with the present invention. The new characteristic results when reference voltage VREF is set to the same voltage value on which a crossing point of the data eye shown in FIG. 9 is positioned. FIG. 6 clearly shows that the ISI which are measured at a reference voltage VREF which is adjusted, i.e., is calibrated in accordance with the present invention, are clearly smaller than those at non-adjusted reference voltages in accordance with the prior art.

Figure 7:
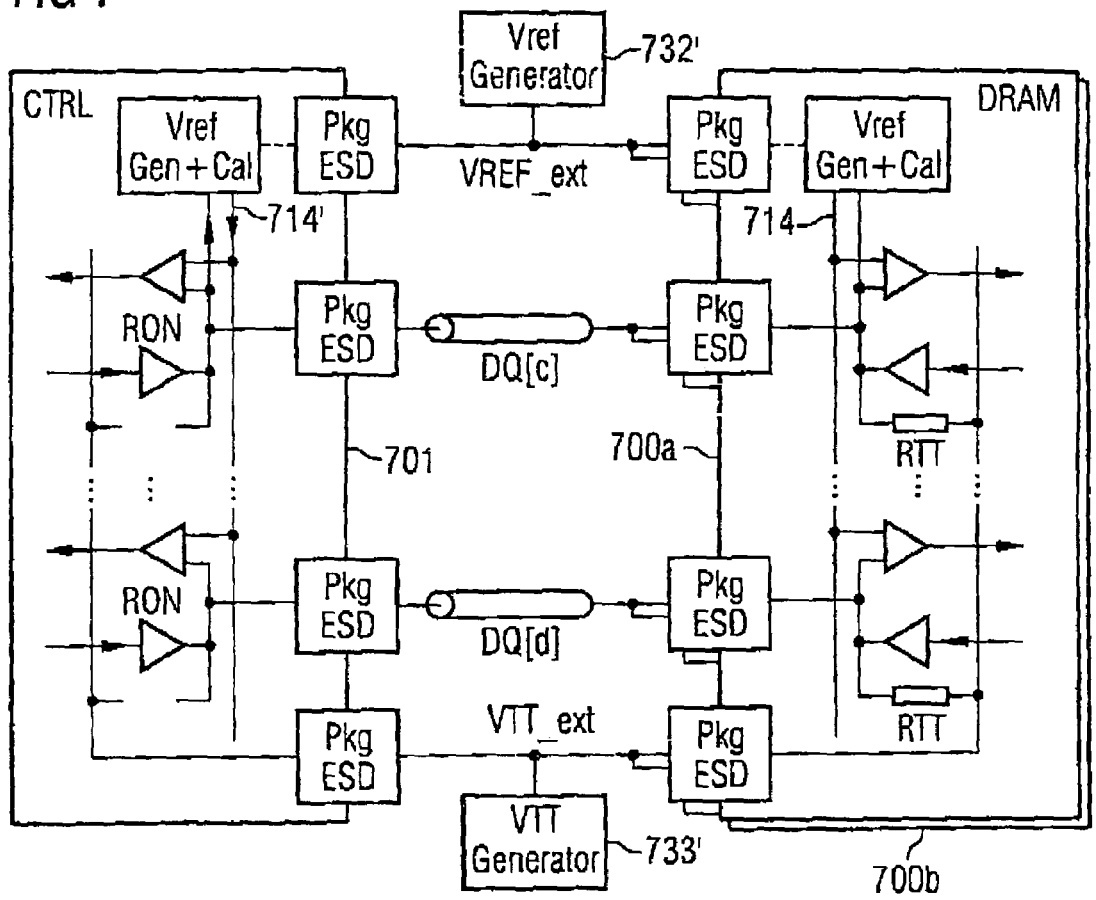
FIG. 7 is a schematic representation of an arrangement of several circuits in accordance with the present invention.
Figure 8:
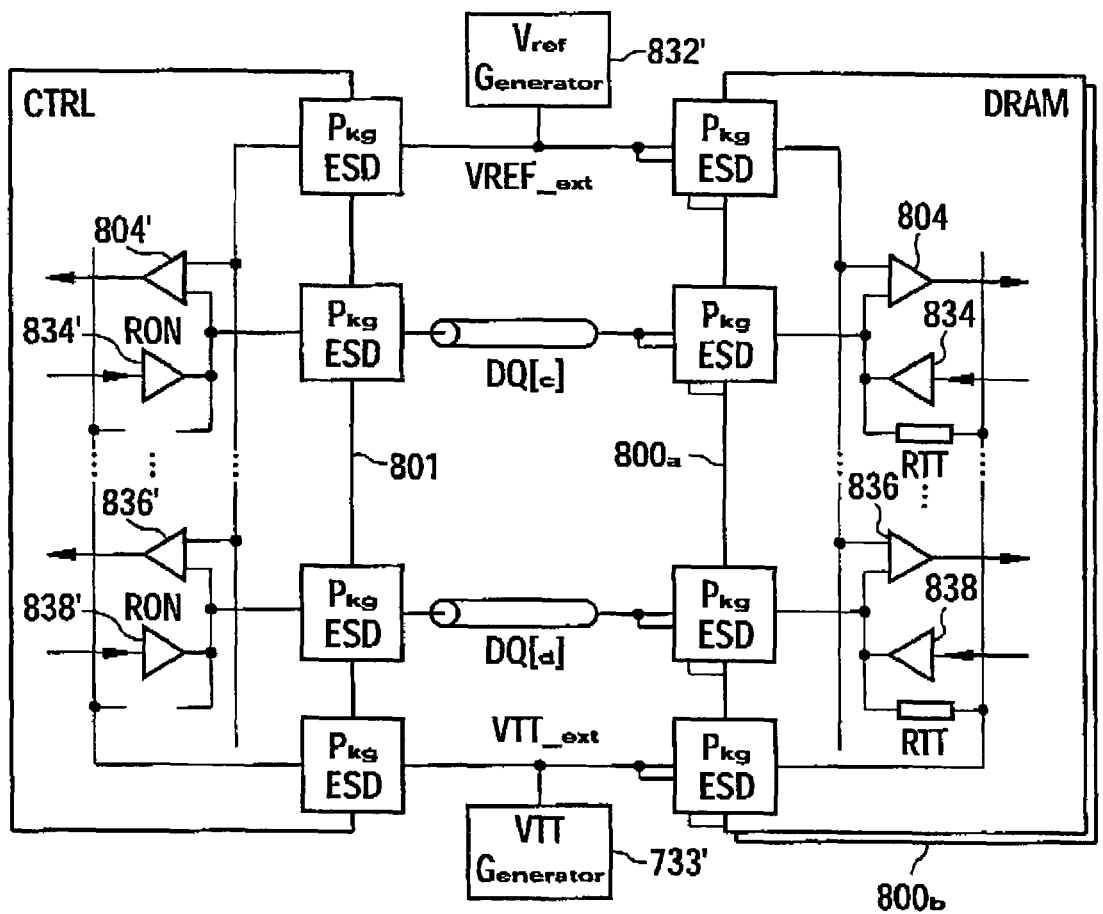
FIG. 8 is a diagrammatic representation of a memory system in accordance with the prior art.

FIG. 7 shows a schematic representation of an arrangement of several inventive circuits in the form of a memory system consisting of two memory chips 700a, 700b, as are described in FIG. 2, as well as of a memory controller 701, which is also implemented in accordance with the present invention. The schematic representation depicted in FIG. 7 corresponds to a point to two-point connection (P22P) with an inventive reference voltage calibration circuit on each chip. In a write case, data is written from the memory controller 701 to one or both of memory chips 700a, 700b. Similarly, memory chips 700a, 700b may also transfer data to memory controller 701. FIG. 7 depicts a reference voltage generator 732' providing a reference voltage to signal VREF_ext. Similarly, a termination voltage generator 733' is also shown, which provides a termination voltage to signal VTT_ext.

The following method may be performed for calibrating reference voltages 714, 714' in the circuits.

At the start of the calibration and/or in a configuration mode, a transmitter, in this case memory controller 701 and a receiver, in this case memory chips 700a, 700b, are placed into a calibration status.

During the calibration, the transmitter sends a specific sequence of zeros and ones on selected pins DQ[c] or on all pins. This sequence may alternate, for example, with each new data bit, i.e., 010101 . . . , or with every other data bit, i.e., 001100110011 . . . The latter is particularly advantageous, in the DDR concept, for eliminating duty cycle influences in VREF calibration. Eventually, a further possibility is to use any bit sequence wherein it is merely ensured that an equal number of zeros and ones are sent within a specific number of bits. Such a sequence, for example repeating sequence 00100111, is referred to as DC-balanced code.

The receiver determines an ideal value of its reference voltage 714. This may be effected, for example, by arithmetic, temporal averaging of one or several input signals by means of an integrator (depicted in FIG. 2).

At the end of the calibration operation, the reference voltage 714 determined is stored on the receiver, e.g., in the register shown in FIG. 4, and is used, from now on, for receiving signals in the receiver.

Subsequently, the transmitter and the receiver leave the calibration status and continue their normal functions, or start a further calibration operation, possibly with swapped roles, with a bidirectional data transfer.

Calibration of an output drive strength RON and a termination resistor RTT may optionally be performed or dispensed with, depending on the degree of the variations caused by process fluctuations, supply voltage tolerances and temperature dependencies.

Even though the above embodiments specifically relate to memory circuits, the inventive approach of a reference voltage generation may also be employed in any other circuits. In addition, it is feasible to generate the reference voltage in a circuit and to pass it on to further, separate circuits. In addition, it may be advantageous to continuously adjust the reference level on the fly. In this case, an additional signal input is required, at which a signal is provided, on the basis of the properties of which the reference level is continuously determined.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit, comprising:
   a data signal input;
   a determinator for determining a reference level based on properties of a calibration signal received at the data signal input during a calibration mode, wherein the properties of the calibration signal comprise a first signal level, corresponding to a first signal value of the calibration signal, and a second signal level, corresponding to a second signal value of the calibration signal, wherein the calibration signal comprises a DC-balanced code; and
   an evaluator for evaluating a data signal received at the data signal input during a normal mode that occurs after the calibration mode, the evaluating being based on the reference level, the evaluator further for providing an information based on the evaluation for further circuit units of the circuit, wherein the determinator is adapted to determine the reference level from the calibration signal applied at the data signal input.

2. A circuit, comprising:
   a signal input;
   a determinator for, within a configuration mode, determining a reference level based on properties of a signal received at the signal input;
   a sample and hold buffer for sampling and storing a determined reference level value of the reference level, the sample and hold buffer being configured to output the stored reference level value as the reference level within a normal mode, which follows the configuration mode; and
   an evaluator for, within the normal mode, evaluating the signal received at the signal input based on the stored reference level value and, based on the evaluation, providing an information for further circuit units of the circuit.

3. The circuit as claimed in claim 2, further comprising a control logic for placing the circuit into the configuration mode by a control signal, wherein the determinator comprises an integrator for integrating the data signal, the integrator being resettable via the control signal.

4. The circuit as claimed in claim 3, wherein the control logic is configured to place the circuit into the configuration mode upon the application of a configuration signal to command and address inputs of the circuit, the application of a supply voltage for a RESET operation.

5. The circuit as claimed in claim 2, wherein the signal input is a payload data input, where, in a normal operation load, the information comprises payload data for the circuit.

6. The circuit as claimed in claim 1, wherein the determinator for determining comprises a generator for generating a mean value from the first signal level and the second signal level of the signal received at the data signal input, so as to determine the reference level based on the mean value.

7. The circuit as claimed in claim 6, wherein the generator for generating a mean value comprises an RC member, whose time constant is large in comparison with a period of the data signal received at the data signal input, wherein a voltage which is falling across a capacitor of the RC member is output as the mean value at an output of the generator.

8. The circuit as claimed in claim 6, wherein the generator for generating a mean value comprises an operational amplifier.

9. A circuit, comprising:
   a signal input;
   a determinator for determining a reference level on the basis of properties of a calibration signal received at the signal input within a calibration mode, wherein the properties of the calibration signal comprise a first signal level, corresponding to a first signal value of the calibration signal, and a second signal level, corresponding to a second signal value of the calibration signal;
   wherein the determinator for determining comprises a generator for generating a mean value from the first signal level and the second signal level of the calibration signal received at the signal input, so as to determine the reference level based on the mean value, and wherein the determinator for determining a reference level further comprises an analog-to-digital converter for analog-to-digital converting the mean value into a digital mean-value signal, and a register for storing the digital mean-value signal; and
   an evaluator for evaluating, within a normal mode following the calibration mode, a data signal received at the signal input based on the digital mean-value signal and, based on the evaluation, providing an information for further circuit units of the circuit.

10. The circuit as claimed in claim 9, wherein the determinator for determining a reference level further comprises a digital-to-analog converter for digital-to-analog converting the digital mean-value signal, and the evaluator is configured to perform the evaluation based on the digital-to-analog converted digital mean-value signal.

11. The circuit as claimed in claim 1, further comprising a reference signal input for receiving an external reference signal, and wherein the determinator for determining is configured to set the reference level based on the external reference signal for an initialization mode.

12. A circuit, comprising:
   a signal input
   a determinator for determining a reference level based on properties of a calibration signal received at the signal input; and
   an evaluator for evaluating a data signal received at the signal input based on the reference level and, based on the evaluation, providing an information for further circuit units of the circuit, wherein the determinator for determining comprises a default input for receiving test data, and wherein the determinator for determining is configured to set the reference level based on the test data for a test mode.

13. A circuit, comprising:

a first signal input for receiving a first signal;

a second signal input for receiving a second signal;

a determinator for determining a first reference level based on properties of the first signal received at the first signal input within a calibration mode;

a first evaluator for evaluating the first signal received at the first signal input within a normal mode following the calibration mode based on the reference level and, based on the evaluation, providing a first information for further circuit units of the circuit; and a second evaluator for evaluating the second signal received at the second signal input within the normal mode based on the reference level and, based on the evaluation, providing a second information for further circuit units of the circuit.

14. The circuit as claimed in claim 1, further comprising a third signal input, a second determinator for determining a second reference level based on properties of a third signal received at the third signal input within the calibration mode, and a third evaluator for evaluating the third signal received at the third signal input within the normal mode based on the second reference level.

15. A circuit comprising:

a signal input;

means for determining a reference level based on properties of a signal received at the signal input; and means for evaluating the signal received at the signal input based on the reference level.

16. A method comprising:

providing a calibration signal at a data signal input within a calibration mode;

determining a reference level based on properties of the calibration signal received at the data signal input;

sampling and storing the determined reference level value of the reference level in a sample and hold buffer; and evaluating, within a normal mode following the calibration mode, a data signal received at the data signal input based on the stored reference level value to obtain, based on the evaluation, an information for a circuit comprising the data signal input.

17. A circuit comprising:

a data signal input;

a determinator for determining a reference level based on properties of a calibration signal received at the data signal input within a calibration mode, wherein the determinator is configured to generate a mean value by means of an averaging over a plurality of signal changes of the calibration signal received at the data signal input to derive the reference level based on the mean value; and an evaluator for evaluating a data signal received at the data signal input based on the reference level and, based on the evaluation, providing an information for further circuit units of the circuit.

18. A method comprising:

providing a calibration signal at a data signal input within a calibration mode;

determining a reference level based on properties of the calibration signal received at the data signal input, wherein the determination involves generating a mean value by means of averaging over a plurality of signal changes of the calibration signal received at the data signal input to derive the reference level based on the mean value;

sampling and storing a determined reference level value of the reference level in a sample and hold buffer; and evaluating, within a normal mode following the calibration mode, a data signal received at the data signal input based on the stored reference level value to obtain, based on the evaluation, an information for a circuit comprising the data signal input.

19. The circuit as claimed in claim 1, wherein the circuit is a DRAM and the data signal input comprises a DQ signal input of the DRAM.

20. The circuit as claimed in claim 2, wherein the circuit is a DRAM and the signal input comprises a DQ signal input of the DRAM.

21. The circuit as claimed in claim 9, wherein the circuit is a DRAM and the signal input comprises a DQ signal input of the DRAM.

22. The circuit as claimed in claim 12, wherein the circuit is a DRAM and the signal input comprises a DQ signal input of the DRAM.

23. The circuit as claimed in claim 13, wherein the circuit is a DRAM and the first signal input comprises a DQ signal input of the DRAM.

24. The method as claimed in claim 16, wherein the data signal input comprises a DQ signal input of a DRAM.

25. The circuit as claimed in claim 17, wherein the data signal input comprises a DQ signal input of a DRAM.

26. The method as claimed in claim 18, wherein the data signal input comprises a DQ signal input of a DRAM.

* * * * *